(12) United States Patent
Gibson

(10) Patent No.: US 10,381,182 B2
(45) Date of Patent: Aug. 13, 2019

(54) PLUG-ON NEUTRAL CIRCUIT BREAKERS WITH LOCKOUTS AND RELATED LOADCENTERS AND METHODS

(71) Applicant: Eaton Intelligent Power Limited, Dublin (IE)

(72) Inventor: Jeffrey Scott Gibson, Hookstown, PA (US)

(73) Assignee: Eaton Intelligent Power Limited, Dublin (IE)

( * ) Notice: Subject to any disclaimer, the term of this patent is extended or adjusted under 35 U.S.C. 154(b) by 21 days.

(21) Appl. No.: 15/840,029

(22) Filed: Dec. 13, 2017

(65) Prior Publication Data
US 2019/0180966 A1   Jun. 13, 2019

(51) Int. Cl.
| H01H 71/02 | (2006.01) |
| H01H 71/00 | (2006.01) |
| H01H 71/10 | (2006.01) |
| H05K 1/18 | (2006.01) |
| H02B 1/052 | (2006.01) |
| H01H 71/24 | (2006.01) |

(52) U.S. Cl.
CPC ...... *H01H 71/0264* (2013.01); *H01H 71/002* (2013.01); *H01H 71/1009* (2013.01); *H01H 71/2463* (2013.01); *H02B 1/052* (2013.01); *H05K 1/18* (2013.01); *H01H 2300/024* (2013.01); *H01H 2300/042* (2013.01); *H01H 2300/044* (2013.01); *H05K 2201/10053* (2013.01)

(58) Field of Classification Search
CPC ......... H01H 71/0264; H01H 2300/024; H01H 2300/042; H01H 2300/044; H02B 1/052
See application file for complete search history.

(56) References Cited

U.S. PATENT DOCUMENTS

| 4,167,769 | A | 9/1979 | Luke et al. |
| 4,351,583 | A | 9/1982 | Belttary |
| 4,743,204 | A | 5/1988 | Fromm et al. |
| 4,785,377 | A | 11/1988 | Rhodes |
| 6,591,482 | B1 | 7/2003 | Fleege et al. |
| 7,449,645 | B1 | 11/2008 | Flegel |
| 7,957,122 | B2 | 6/2011 | Sharp |
| 8,049,126 | B2 | 11/2011 | Chen et al. |
| 9,112,336 | B2 | 8/2015 | Samuelson |
| 9,184,525 | B1 | 11/2015 | Ranta |
| 9,627,164 | B2 | 4/2017 | Robinson et al. |

(Continued)

OTHER PUBLICATIONS

ABB "Sentricity™ Loadcenters and Circuit Breakers: Raising the standard in residential" *Canadian Catalog, Product Brochure* (12 pages) (Aug. 2017).

(Continued)

*Primary Examiner* — Ramon M Barrera
(74) *Attorney, Agent, or Firm* — Myers Bigel, P.A.

(57) ABSTRACT

Plug-on neutral circuit breakers include a housing, a plug-on neutral clip with legs extending out from the housing and a mechanical coupler of a lockout latch assembly in the housing coupled to a latch link and the plug-on neutral clip to move the mechanical coupler in response to a change in position of the plug-on neutral clip between first and second positions associated with partially and fully installed orientations to thereby provide a lockout state when not in the second position.

20 Claims, 14 Drawing Sheets

(56) References Cited

U.S. PATENT DOCUMENTS

| | | |
|---|---|---|
| 9,666,398 B2 | 5/2017 | Robinson et al. |
| 10,020,152 B2 | 7/2018 | Pearson et al. |
| 2008/0158788 A1 | 7/2008 | Darr et al. |
| 2008/0289938 A1 | 11/2008 | Raabe et al. |
| 2012/0132506 A1* | 5/2012 | Potratz .................. H01H 83/02 200/43.11 |
| 2013/0188297 A1 | 7/2013 | Ranta |
| 2014/0168862 A1 | 6/2014 | Wheeler |
| 2017/0309431 A1 | 10/2017 | Hiremath et al. |

OTHER PUBLICATIONS

Square D "Plug-on Neutral Load Centers with Qwick-Grip Wire Management System" *Product Brochure*, www.schneider-electric. us/qg (8 pages) (2017).

\* cited by examiner

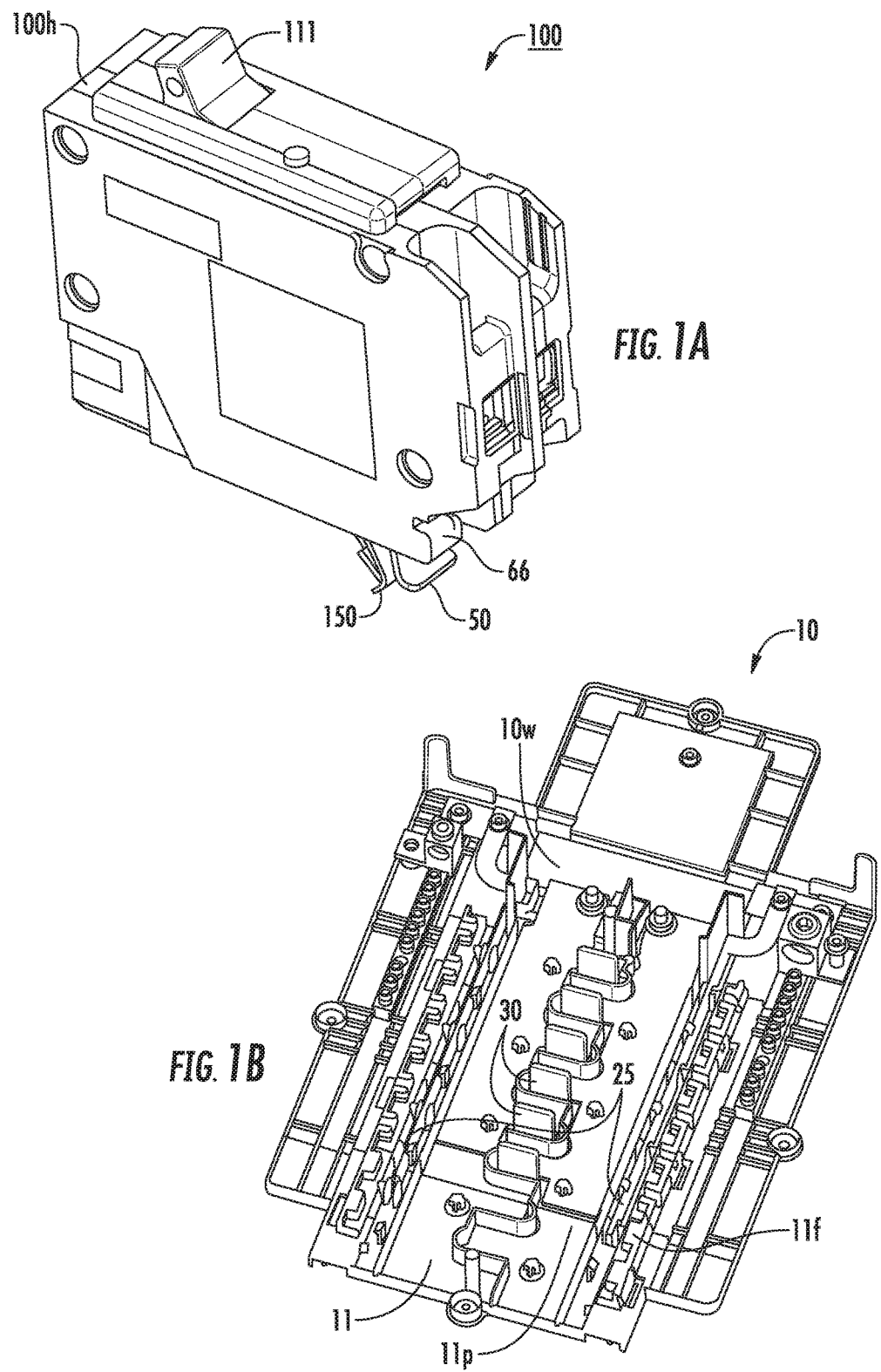

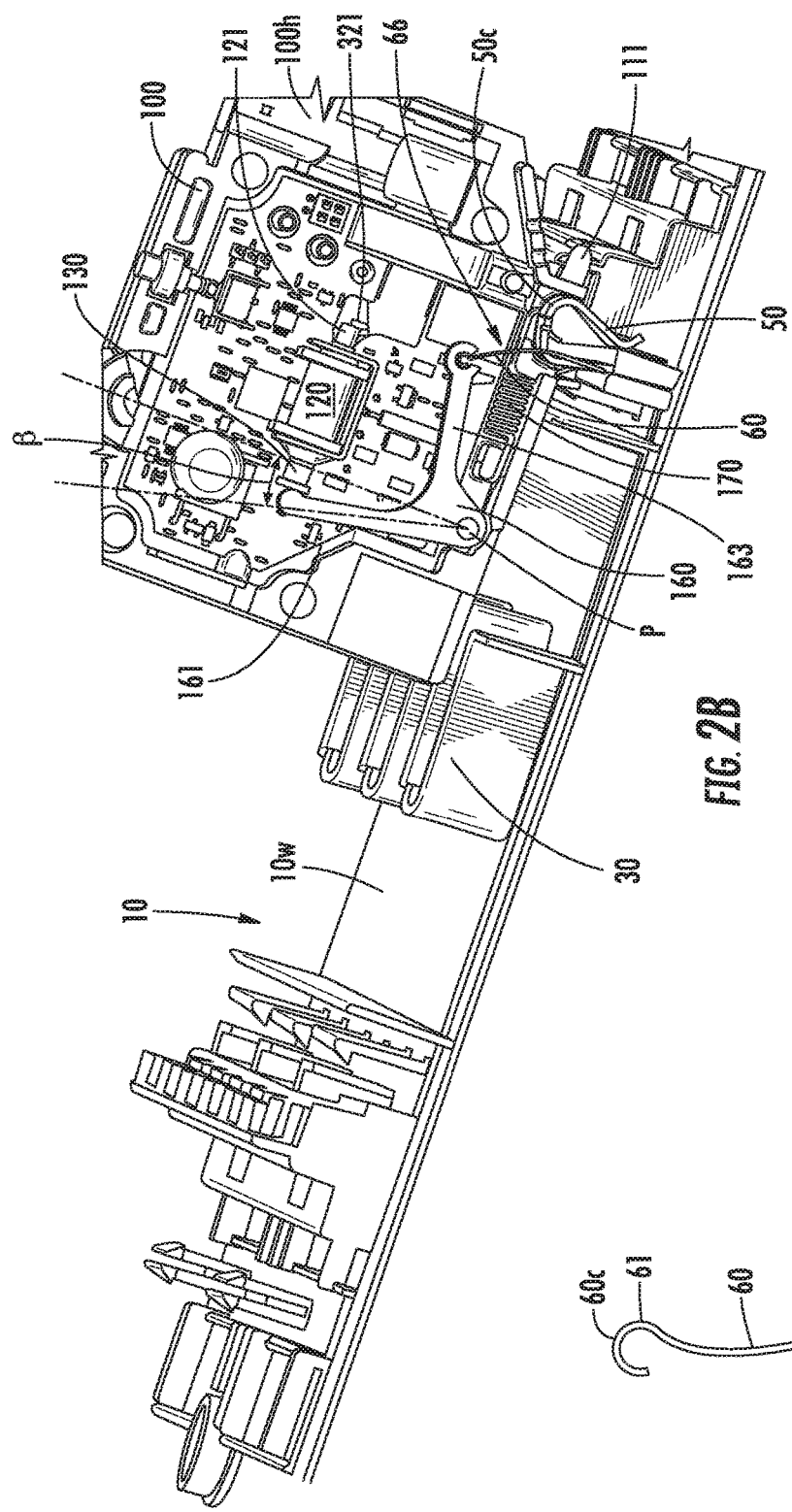

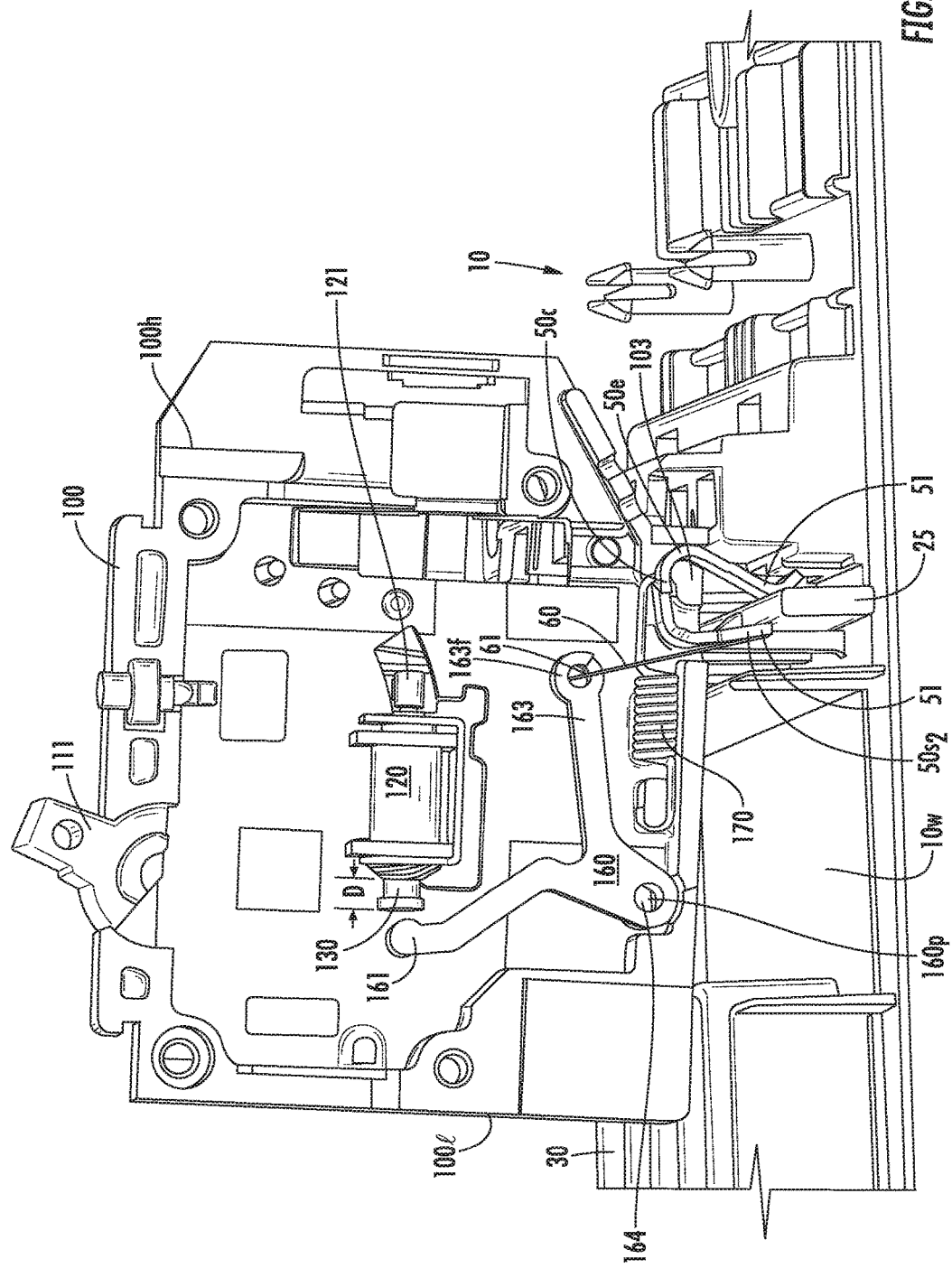

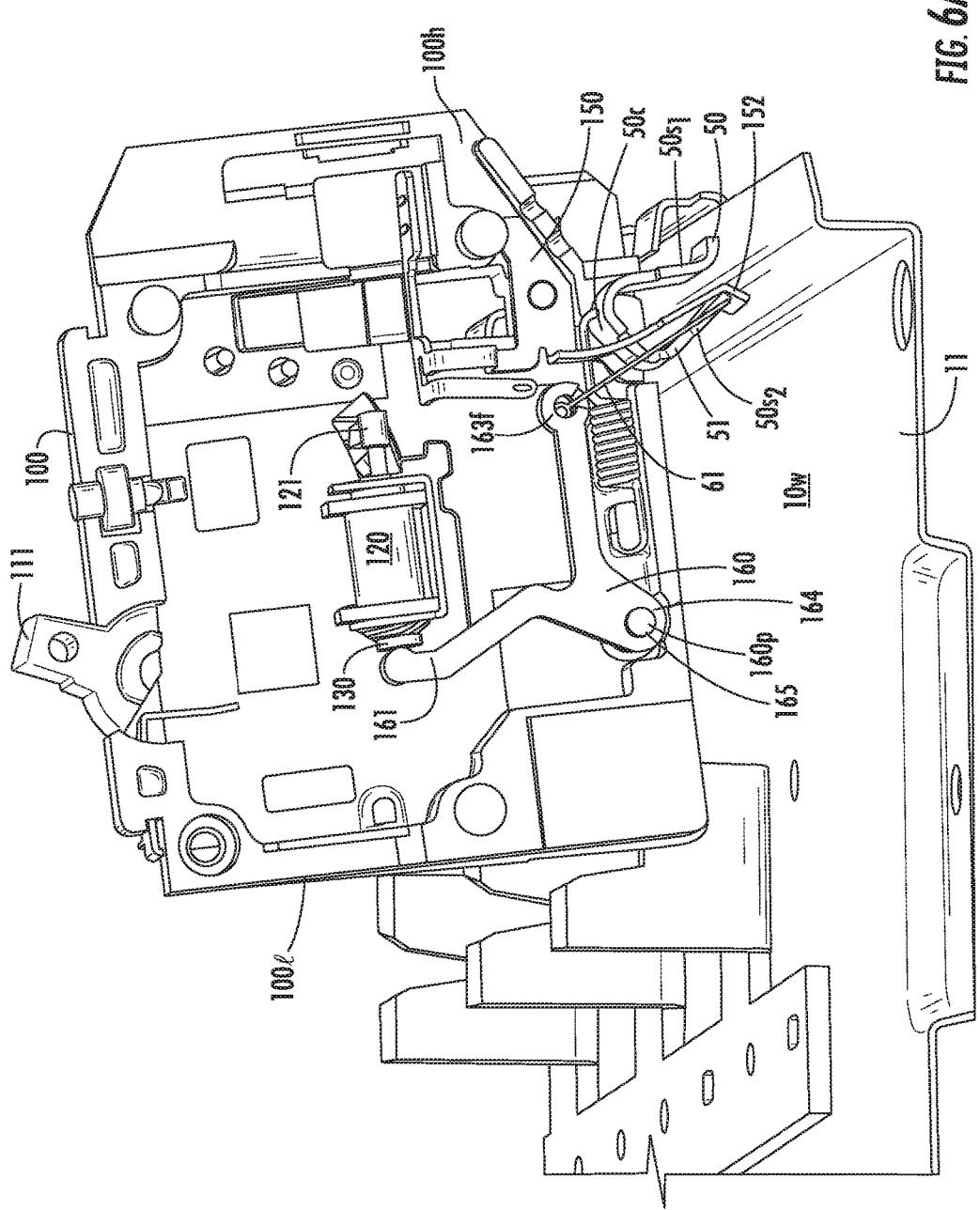

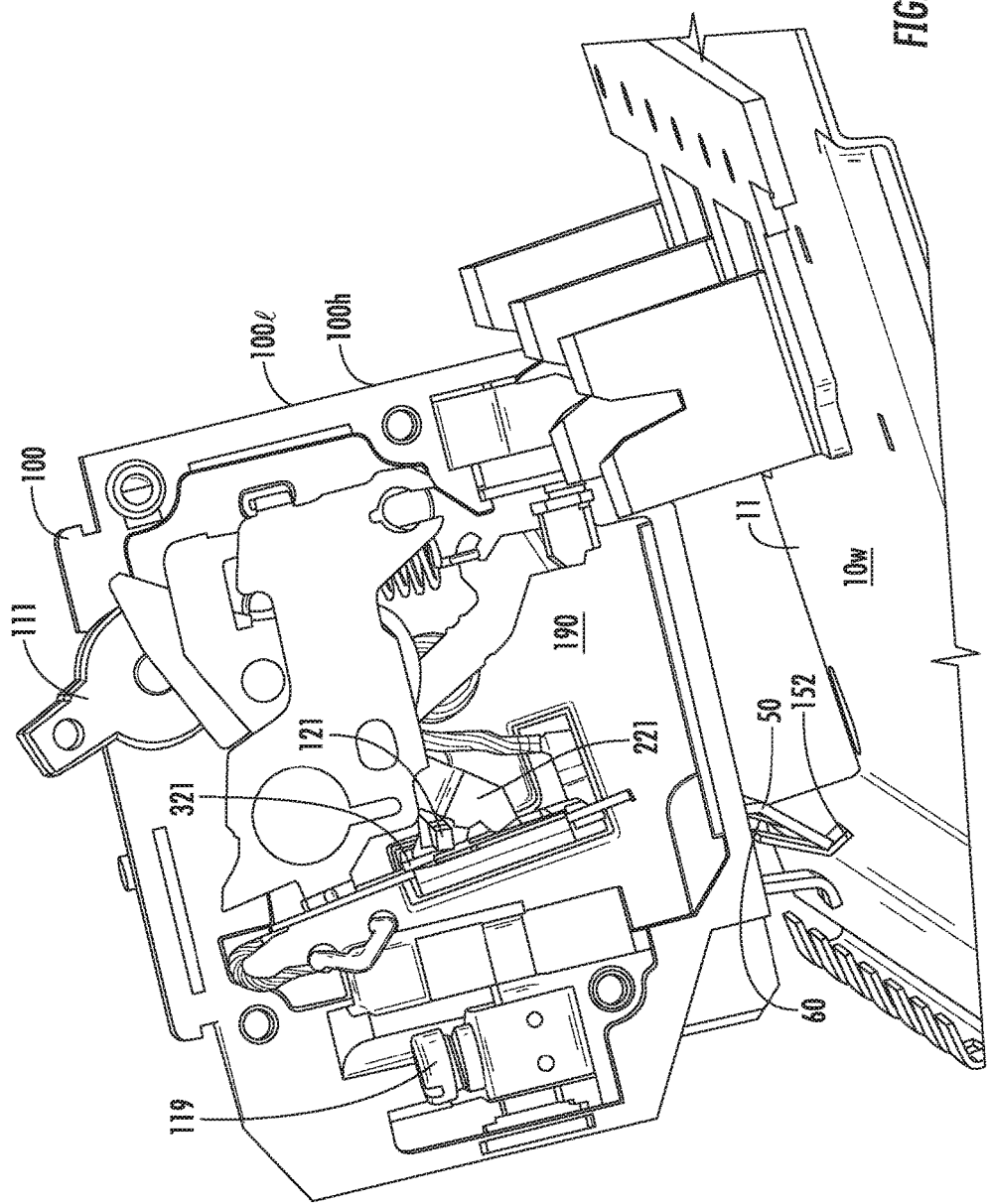

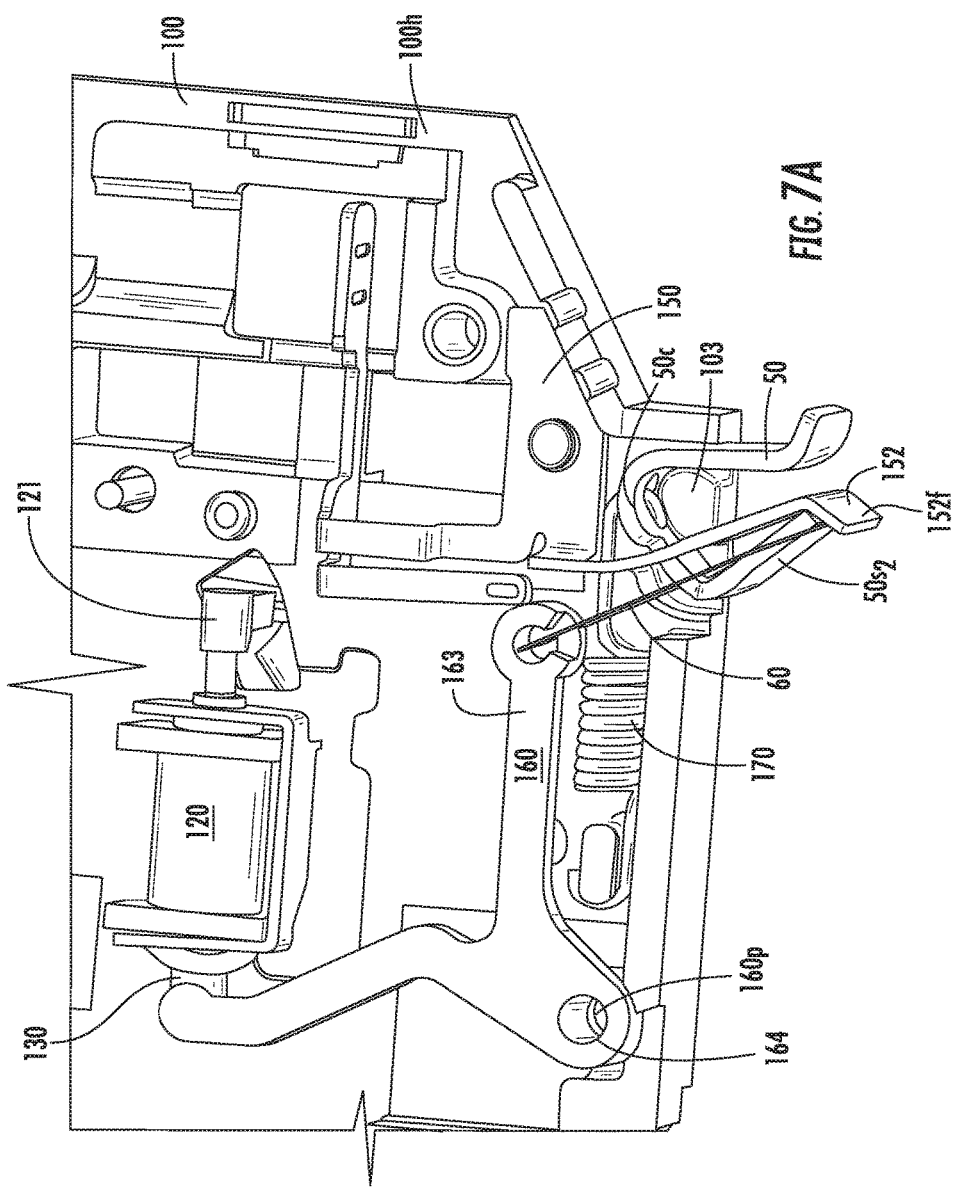

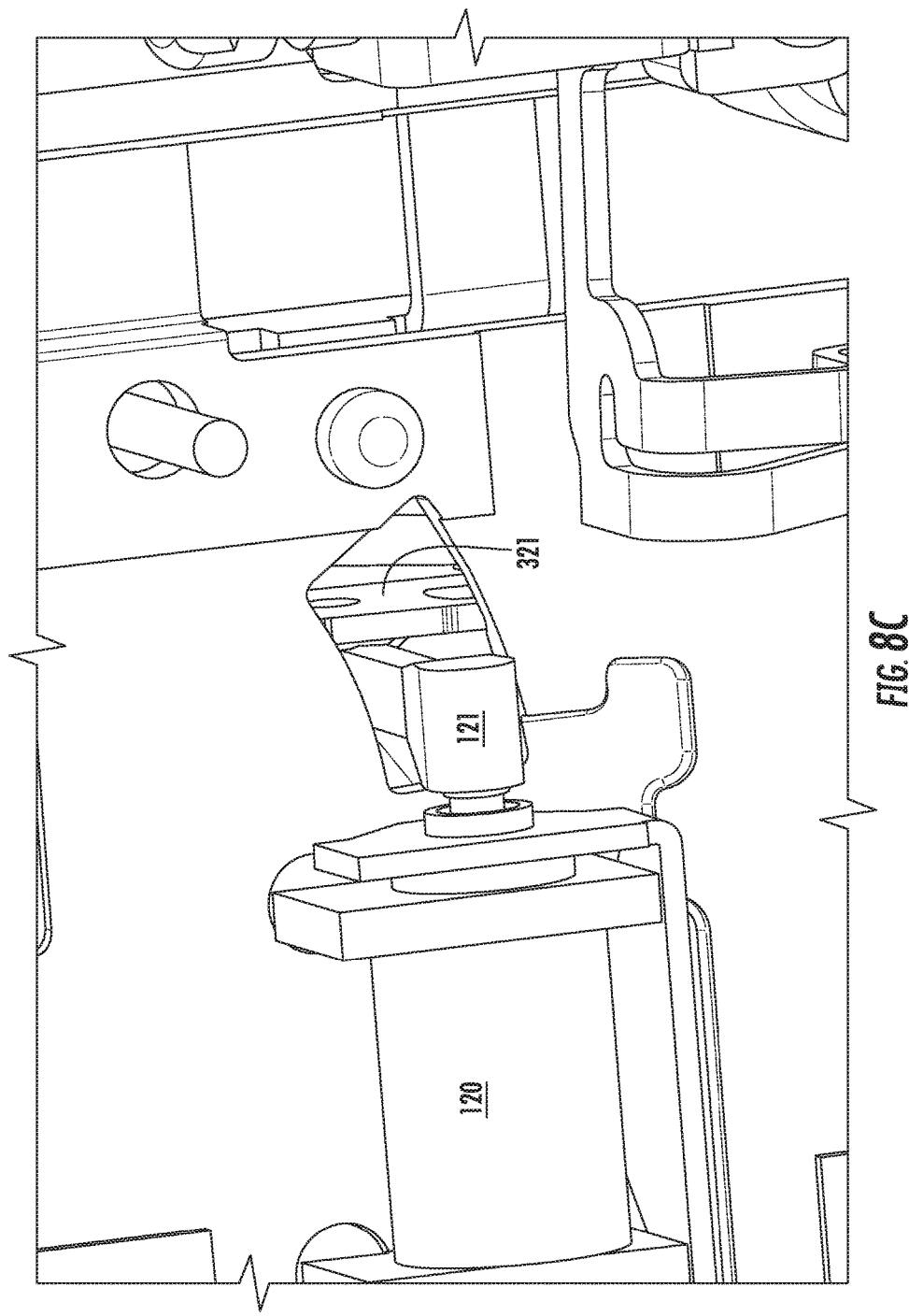

PLUG-ON NEUTRAL CIRCUIT BREAKERS WITH LOCKOUTS AND RELATED LOADCENTERS AND METHODS

FIELD OF THE INVENTION

The present disclosure relates to plug-on neutral breakers.

BACKGROUND OF THE INVENTION

Arc Fault Circuit Interrupters (AFCI) and Ground Fault Circuit Interrupters (GFCI) are among a variety of overcurrent protection devices used for circuit protection and isolation. Arc Fault Circuit Interrupters (AFCIs) reduce fire hazards in electrical circuits by reducing the effects of high current arcing faults (parallel arcs) as well as detecting persistent low-current arcing faults (series arcs). Ground Fault Circuit Interrupters reduce the potential of electrical shock. Dual purpose AFCI/GFCI breakers are available which provide GFCI protection and AFCI protection as combination type breakers from Eaton Corporation. Both branch feeder and combination AFCIs provide conventional thermal and magnetic overcurrent protection. Both also provide high current or "parallel" arcing fault detection and fire mitigation for installed wiring and connected cords.

Loadcenters and similar devices can be configured with neutral bars that allow neutral terminal connections using neutral plug-on clips of circuit breakers.

SUMMARY OF EMBODIMENTS OF THE INVENTION

Embodiments of the present invention provide circuit breakers with a mechanical coupler that is coupled to a neutral plug-on clip that communicates to the circuit breaker whether the neutral plug-on clip is in a first position or a second position to prevent the breaker from allowing conduction when the breaker is not properly installed.

Other embodiments are directed to methods of providing a lockout function to prevent conduction if the circuit breaker is not properly or fully installed using a mechanical coupler that optionally moves a plunger extension of the trip solenoid between lock out states and operational states.

Yet other embodiments are directed to circuit breakers that include a housing and a plug-on neutral clip held by the housing. The plug-on neutral clip has a crown held in the housing and first and second legs that extend out from the housing. The plug-on neutral clip is held by the housing to be able to slidably move between a first position associated with an uninstalled, partially installed or improperly installed circuit breaker orientation and a second position associated with a properly fully installed circuit breaker orientation. The circuit breakers also include a mechanical coupler in the housing coupled to the plug-on neutral clip and configured to provide a lockout state of the circuit breaker and only allow conduction through a breaker mechanism in the housing when the plug-on neutral clip is in the second position to thereby block the breaker mechanism from conduction in the lockout state of the circuit breaker when in the first position.

The mechanical coupler can be pivotably attached to a printed circuit board and/or to the housing.

The circuit breaker can include a link member coupled to one of the legs of the plug-on neutral clip and to the mechanical coupler.

At least a segment of the link member can be configured to move in the housing from the first position to the second position.

The mechanical coupler can be pivotably attached at a location that is closer to a line side perimeter of the housing than a load side and on a side of the housing with the legs of the plug-on clip.

The mechanical coupler can be pivotably attached to a circuit board holding a trip solenoid and/or to the housing and the mechanical coupler can include spaced apart first and second arms, one on each side of the pivot attachment.

The first arm can extend at an angle between 60-120 degrees from the second arm.

The first arm can be coupled to a plunger of a trip solenoid and the second arm can be coupled to the plug-on neutral clip.

The first arm can rotate at an angle $\beta$ that is between 10-30 degrees to cause a plunger extension of the trip solenoid to linearly extend and retract. The plunger extension can be extended to engage a latch of the breaker mechanism in the first position to force a no-latch condition for the breaker mechanism in the circuit breaker and prevent conduction in an ON position. The plunger extension can retract toward the trip solenoid a distance sufficient to release the latch and allow conduction in the ON position in the second position.

The circuit breaker can include a link member having first and second end portions and the mechanical coupler can be pivotably attached to a circuit board holding a trip solenoid and/or to the housing. The mechanical coupler can have first and second arms. The first arm can be coupled to a plunger of a trip solenoid and the second arm can be coupled to the first end portion of the link member. The second end portion of the link member can be coupled to the plug-on neutral clip.

The circuit breaker can include a neutral bus in the housing with a leg that extends out of the housing between the first and second legs of the plug-on neutral clip and that also engages the first or second leg of the plug-on neutral clip. The circuit breaker can be a plug-on neutral type BR or CH circuit breaker or a dual purpose AFCI/GFCI.

The second end portion of the link member can be coupled to an inner one of the first and second legs of the plug-on neutral clip which is closest to a line side of the circuit breaker.

The link member can have a curvilinear shape.

One of the first and second legs of the plug-on neutral clip can include a laterally extending ledge that is outside the housing and is coupled to the second end portion of a link member.

Embodiments of the present invention are directed to a load center that includes the circuit breakers discussed above. The load center can include a wall holding at least one vertically extending neutral bar having a planar and straight outwardly extending rectangular body and one or more line side stabs. The plug-on neutral clip of a respective circuit breaker can slidably engage the neutral bar. One or more terminals at a line side of the housing of the circuit breaker can engage the one or more line side stabs.

The mechanical coupler of the circuit breaker can be pivotably attached to the housing and/or a circuit board holding a trip solenoid at a pivot joint and can include first and second spaced apart arms, one on each side of the pivot joint. Once the plug-on neutral clip slidably engages the neutral bar, rotation of a line side of the housing of the circuit breaker into the one or more line stabs to the properly and fully installed orientation can cause the plug-on neutral clip to move to the second position to push an end of the first arm of the mechanical coupler which can rotate the second arm and retract a plunger extension toward the trip solenoid thereby allowing conduction. When the circuit breaker is not properly and fully installed with the neutral bus bar and the one or more line stabs, the plug-on neutral clip can be in the first position which can rotate the end of the first arm to force the second arm to push the plunger toward the trip solenoid and extend the plunger extension relative to the trip solenoid thereby blocking the breaker mechanism to prevent conduction in an ON position of a handle of the circuit breaker.

Other embodiments are directed to methods for lockout of a plug-on neutral circuit breaker. The methods include: providing a load center with a plug-on neutral bar; providing a circuit breaker with a plug-on neutral clip and an onboard mechanical coupler that is coupled to the plug-on neutral clip; attaching the plug-on neutral clip to the neutral bar; moving the mechanical coupler between (i) a lock out state to force a no latch condition for a breaker mechanism of the circuit breaker preventing conduction when the circuit breaker is uninstalled or partially installed based on a first position of the plug-on neutral clip when attached to the neutral bar and (ii) an operative state allowing conduction based on a second position of the attached plug-on neutral clip associated with proper installation.

The circuit breaker can further include a neutral bus with a leg that extends out of the housing and also engages the plug-on neutral clip. The attaching step can include forcing the leg of the neutral bus against the neutral bus bar of the load center using the plug-on neutral clip. The mechanical coupler can be attached to a link member that is attached to the plug-on neutral clip. The moving the mechanical coupler can include rotating the mechanical coupler in response to movement of the link member between the first and second positions of the attached plug-on neutral clip The mechanical coupler can be pivotably attached to a circuit board and/or housing of the circuit breaker and can have first and second arms. The first arm can be coupled to a plunger of a trip solenoid and the second arm can be coupled to the link member. The rotating can include pivoting the first and second arms in concert so that the first am extends the plunger out of the trip solenoid and retracts a plunger extension of the trip solenoid in response to the link member pivoting the second arm inward to thereby allow the operative state.

The method can also include rotating a line side of the housing of the circuit breaker inward toward a line side stab or stabs after attaching the plug-on neutral clip to the neutral bar which can cause the movement of the mechanical coupler to allow conduction in the operative state only when the line side of the housing is properly installed.

Further features, advantages and details of the present invention will be appreciated by those of ordinary skill in the art from a reading of the figures and the detailed description of the preferred embodiments that follow, such description being merely illustrative of the present invention.

It is noted that aspects of the invention described with respect to one embodiment, may be incorporated in a different embodiment although not specifically described relative thereto. That is, all embodiments and/or features of any embodiment can be combined in any way and/or combination. Applicant reserves the right to change any originally filed claim or file any new claim accordingly, including the right to be able to amend any originally filed claim to depend from and/or incorporate any feature of any other claim although not originally claimed in that manner. These and other objects and/or aspects of the present invention are explained in detail in the specification set forth below.

BRIEF DESCRIPTION OF THE DRAWINGS

FIG. 1A is a side perspective view of an example circuit breaker according to embodiments of the present invention.

FIG. 1B is a front side perspective view of an example load center according to embodiments of the present invention.

FIG. 2B is a side perspective view of the circuit breaker and load center shown in FIG. 2A with the circuit breaker in a second position relative to the load center according to embodiments of the present invention.

FIG. 3 is an enlarged side view of an exemplary link member useful for a component of the lockout assembly shown in FIG. 1C according to embodiments of the present invention.

FIG. 5A is an enlarged partial view of a load center illustrating a circuit breaker with the plug-on neutral clip in a properly installed position and/or orientation according to embodiments of the present invention.

FIG. 6A is an enlarged partial view of a load center illustrating a circuit breaker with the plug-on neutral clip in an improperly installed position and/or orientation according to embodiments of the present invention.

FIG. 6B is an opposing side view of that shown in FIG. 6A.

FIGS. 7A and 7B are greatly enlarged partial side perspective views of a circuit breaker with the mechanical coupler, flexing (deformable) link member, plug-on neutral clip and neutral bus according to embodiments of the present invention

FIG. 8C is an enlarged partial view of the conduction unblocked configuration shown in FIG. 8B showing the plunger extension of the trip solenoid retracted from the latch according to embodiments of the present invention.

DETAILED DESCRIPTION OF EMBODIMENTS OF THE INVENTION

Figure 1C:
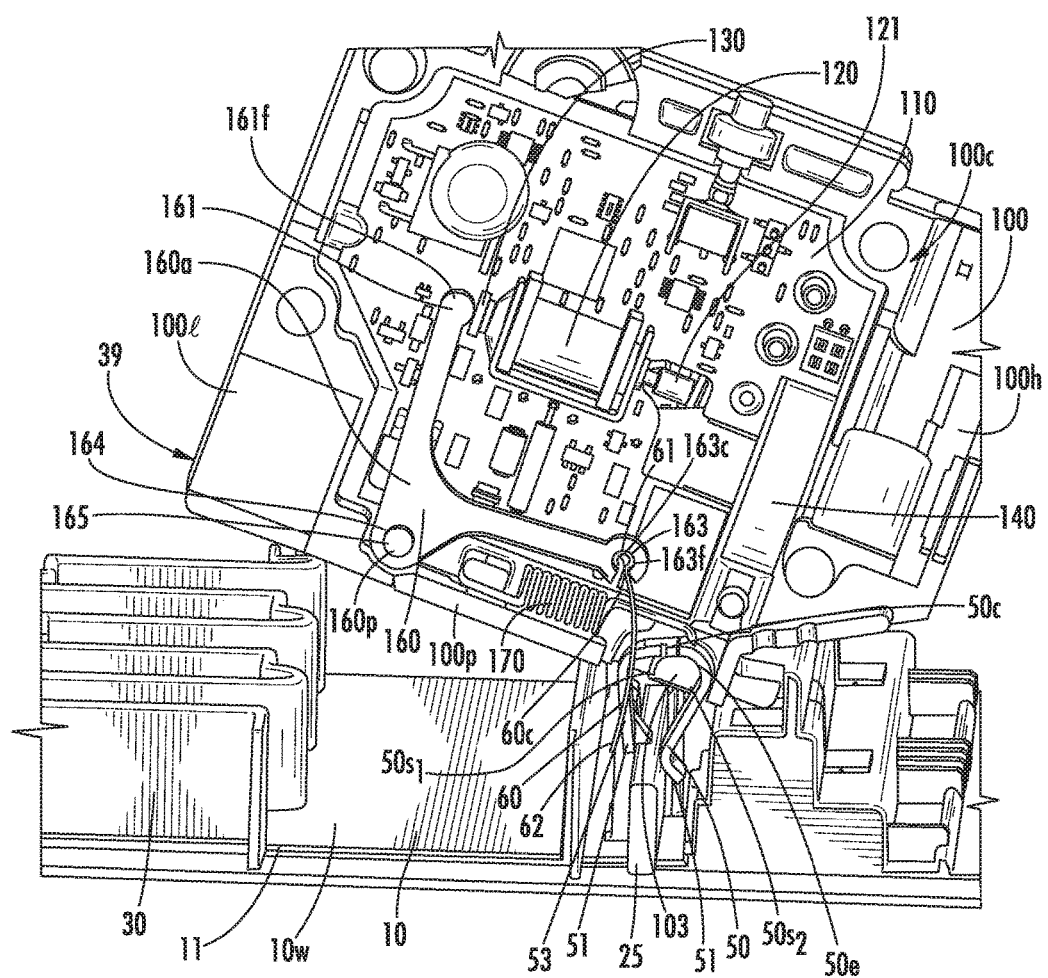
FIG. 1C is an enlarged side partial perspective view of a portion of an exemplary breaker and load center according to embodiments of the present invention.

The present invention now will be described more fully hereinafter with reference to the accompanying drawings, in which illustrative embodiments of the invention are shown. Like numbers refer to like elements and different embodiments of like elements can be designated using a different number of superscript indicator apostrophes (e.g., 10, 10', 10", 10'''). The terms "Fig." and "FIG." may be used interchangeably with the word "Figure" as abbreviations thereof in the specification and drawings. In the figures, certain layers, components or features may be exaggerated for clarity, and broken lines illustrate optional features or operations unless specified otherwise.

In the drawings, the relative sizes of regions or features may be exaggerated for clarity. This invention may, however, be embodied in many different forms and should not be construed as limited to the embodiments set forth herein; rather, these embodiments are provided so that this disclosure will be thorough and complete, and will fully convey the scope of the invention to those skilled in the art.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90° or at other orientations) and the spatially relative descriptors used herein interpreted accordingly.

The term "about" refers to numbers in a range of +/−20% of the noted value.

As used herein, the singular forms "a", "an" and "the" are intended to include the plural forms as well, unless expressly stated otherwise. It will be further understood that the terms "includes," "comprises," "including" and/or "comprising," when used in this specification, specify the presence of stated features, integers, steps, operations, elements, and/or components, but do not preclude the presence or addition of one or more other features, integers, steps, operations, elements, components, and/or groups thereof. It will be understood that when an element is referred to as being "connected" or "coupled" to another element, it can be directly connected or coupled to the other element or intervening elements may be present. As used herein, the term "and/or" includes any and all combinations of one or more of the associated listed items.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

Embodiments of the invention are particularly suitable for electrical devices such as loadcenters or wall panels for electrical devices. The terms "loadcenter" and "electrical distribution load center" refer to the collective components of an electrical distribution system and its respective housing that supplies electrical power to one or more subsidiary circuits. The terms "bus," "bus element," "electrical distribution bus," or "bus bar" refers to components in an electrical distribution system that conducts electricity within the load center.

Electrical loadcenters include electrical busses that comprise conductors permitting electrical current to be carried throughout the electrical load center. Electrical busses may contain features permitting attachment of fuses, relays, switches, wires, breakers, and other electrical elements. Loadcenters may contain one or more electrical busses in close proximity to one another, and insulating material or insulation may be used to avoid an arcing or shorting event occurring between the busses. Busses are electrically insulated from each other to avoid a phase-to-phase short circuit. Busses are also electrically insulated from the electrical load center enclosure to avoid a phase-to-ground short circuit. Some loadcenters also include branch circuit breakers connected to the electrical busses at specific points within the load centers. The location, orientation, and spacing of the bus elements and insulation elements within the load are arranged so as to prevent an arcing, overcurrent, or short circuit event once the busses are placed under load. The loadcenters typically include a backpan assembly with a backpan holding a bus structure attached to the back of the enclosure. See, e.g., U.S. Pat. No. 9,112,336, the contents of which are hereby incorporated by reference as if recited in full herein.

Referring now to FIG. 1A, an example circuit breaker 100 with a housing 100h, handle 111 and external corner projection 66 is shown. The circuit breaker 100 can also include a neutral-plug on clip 50 and neutral bus 150. The external corner projection 66 can engage a foot 11f on the backpan 11p of the load center 10 (FIG. 1B) during installation.

Referring to FIGS. 1B and 1C, a wall panel 11 for a load center 10 that couples to one or more circuit breakers 100 is shown. The wall panel 11 includes a wall 10w with at least one line side stab 30 and at least one spaced apart neutral bar 25. As shown, there are two parallel spaced apart neutral bars 25, one on each side of the line stabs 30. The at least one neutral bar 25 can be at least one vertically extending neutral bar having a planar and straight outwardly extending (rectangular) body.

The circuit breaker 100 includes a housing 100h that encloses a printed circuit board 110 with a trip solenoid 120 and plunger 130 on one end of the solenoid 120 and a plunger extension 121 on an opposing end of the solenoid 120. The circuit breaker 100 plug-on neutral clip 50 couples to the neutral bar 25. The plug-on neutral clip 50 can be a spring clip. The circuit breaker 100 can include a current transformer 140 and other circuit components of a circuit breaker circuit 100c.

Figure 8A:
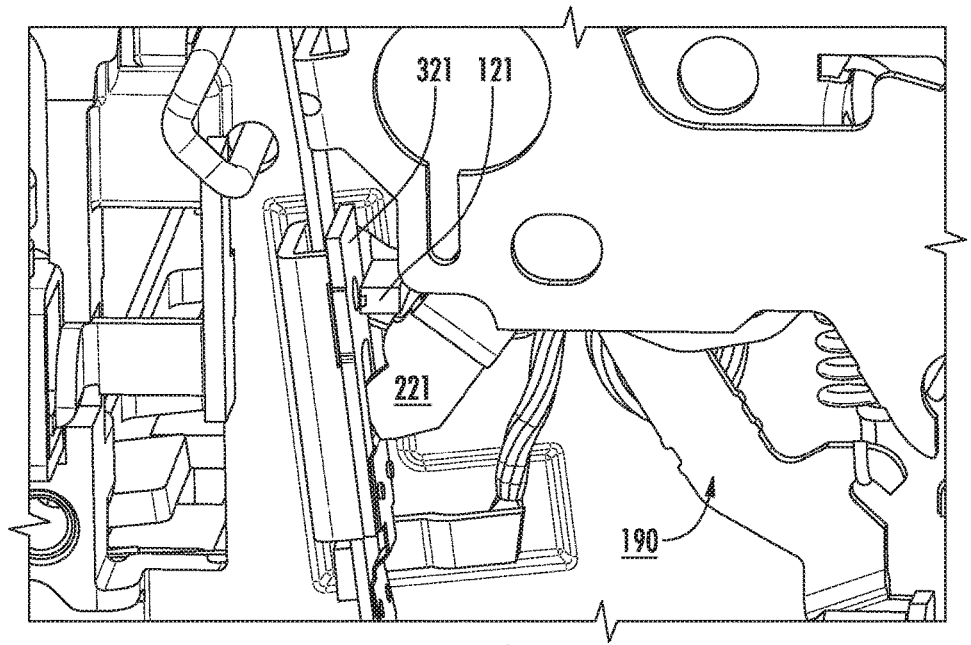
FIG. 8A is an enlarged partial view of a circuit breaker showing a latch in a lockout configuration to prevent conduction according to embodiments of the present invention.

Generally stated, the present invention provides a lockout assembly 160A with a mechanical coupler 160 that can selectively couple to a latch 321 (FIG. 8A) that controllably blocks the breaker mechanism 190 (FIG. 5B, 6B, 8A) from conduction when in a lockout state that is operative depending on an orientation of the mechanical coupler 160 that, in turn, depends on an orientation of the plug-on neutral clip 50.

Figure 8B:
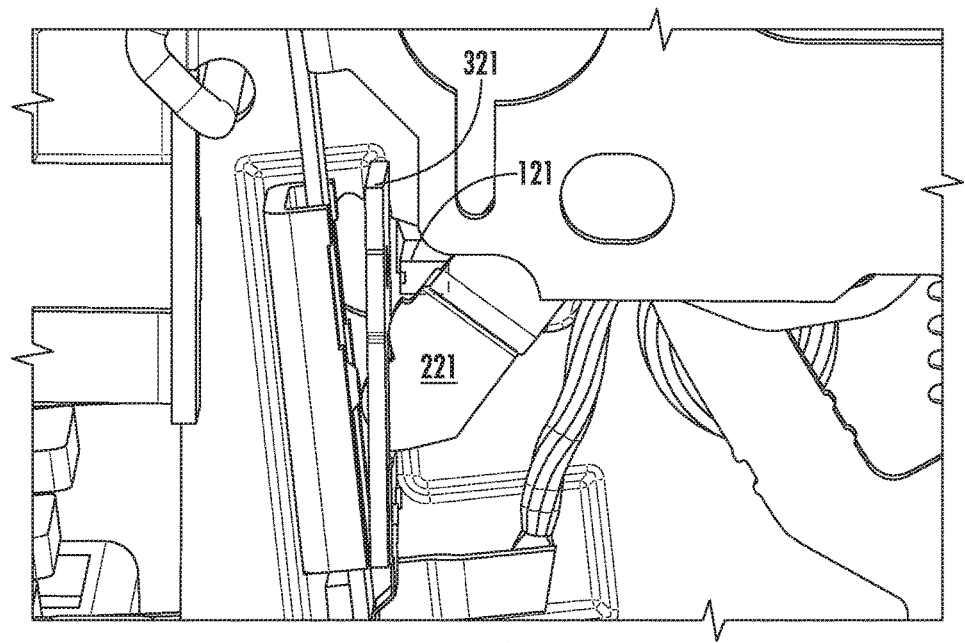
FIG. 8B is an enlarged partial view of the latch in an unblocked configuration allowing conduction according to embodiments of the present invention.

The lockout assembly 160A can latch (FIG. 8A) or delatch the breaker mechanism 190 (FIG. 8B, FIG. 8C) depending on an orientation of the mechanical coupler 160. In the lockout state provided by the lockout assembly 160A (FIG. 8A), even if a user attempts to activate the breaker 100 using a handle input to turn "ON" the breaker, there is no conduction allowed through the breaker mechanism 190. The mechanical coupler 160 can force the latch 321 down against the magnet with the latch link 221 on top of the interior surface of the latch 321 (FIG. 8A) and block conduction through the latch link 221 of the cradle of the breaker mechanism 190 when the breaker 100 is in an improper assembly or installation position as indicated by the position of the plug-on neutral clip 50 (FIG. 6A). During the lockout state provided by the mechanical coupler assembly 160A, the contacts of the breaker mechanism, i.e., the moving contact and the stationary contact, are separated.

As is well known, the circuit breaker 100 can include one or more line side terminals 39 (FIG. 1C) that electrically engage line side stabs 30 (FIG. 1B) in the load center 10.

As shown in FIG. 1C, the circuit breaker 100 can also include a link member 60 that is coupled to the plug-on neutral clip 50 and to the mechanical coupler 160. The mechanical coupler 160 can pivot about a pivot joint 160*p*. The mechanical coupler 160 can have a first arm 161 with a first end portion 161*f* that is optionally coupled to the plunger 130 of the trip solenoid 120. The mechanical coupler 160 can have a second arm 163 with an end portion 163*f* that couples to the link member 60. One or both of the end portions 161*f*, 163*f* can be free ends.

The first arm 161 can extend at an angle of between 60-120 degrees from the second arm 163, more typically between 75 and 100 degrees.

The housing 100*h* can include a projection member 103 that can hold an end 50*e* of the plug-on neutral clip 50 while free legs 51 of the plug-on neutral clip 50 extend out from the housing 100*h* on opposing line and load facing sides, 50*s*₁, 50*s*₂, of the projection member 103 to be able to contact opposing sides of the neutral bar 25. The projection member 103 can have an arcuate and/or a curvilinear perimeter that faces the crown end 50*e* of the plug-on neutral clip 50. The crown end 50*e* of the plug-on neutral clip 50 can rotate relative to the projection member 103 between installed (second position) and uninstalled (first position) configurations. The projection member 103 can slidably engage and/or hold a closed crown end 50*e* of the plug-on neutral clip 50.

The circuit breaker 100 can also include a biasing member 170 that can couple to the plug-on neutral clip 50 and resiliently bias the plug-on neutral clip 50 to a first position. The biasing member 170 can be provided by a coil spring as shown or other resilient members such as a leaf spring, a dome spring washer, a resilient plug or stacked dome spring washers, for example.

Referring to FIG. 1C and FIG. 3, the link member 60 can be configured as a curvilinear metallic member, optionally comprising stainless steel. In some embodiments, the link member 60 can comprise a first end portion 61 that may include a semi-circular or circular end 60*c* that is held captured in a semi-circular or circular channel 163*c* in the free end 163*f* of the second arm 163 of the mechanical coupler 160. A second end portion 62 of the link member 60 is spaced apart from the first end portion 61 and is attached to the plug-on neutral clip 50.

One leg of the plug-on neutral clip 51 (shown as the innermost leg 50*s*₁) can be coupled to the link member 60. This leg of the plug-on neutral clip 51 have a ledge 53 that is outside the housing 100*h* and can be coupled to (i.e., slidably coupled to or fixedly attached to) the second end portion of the link member 62.

Figure 2A:
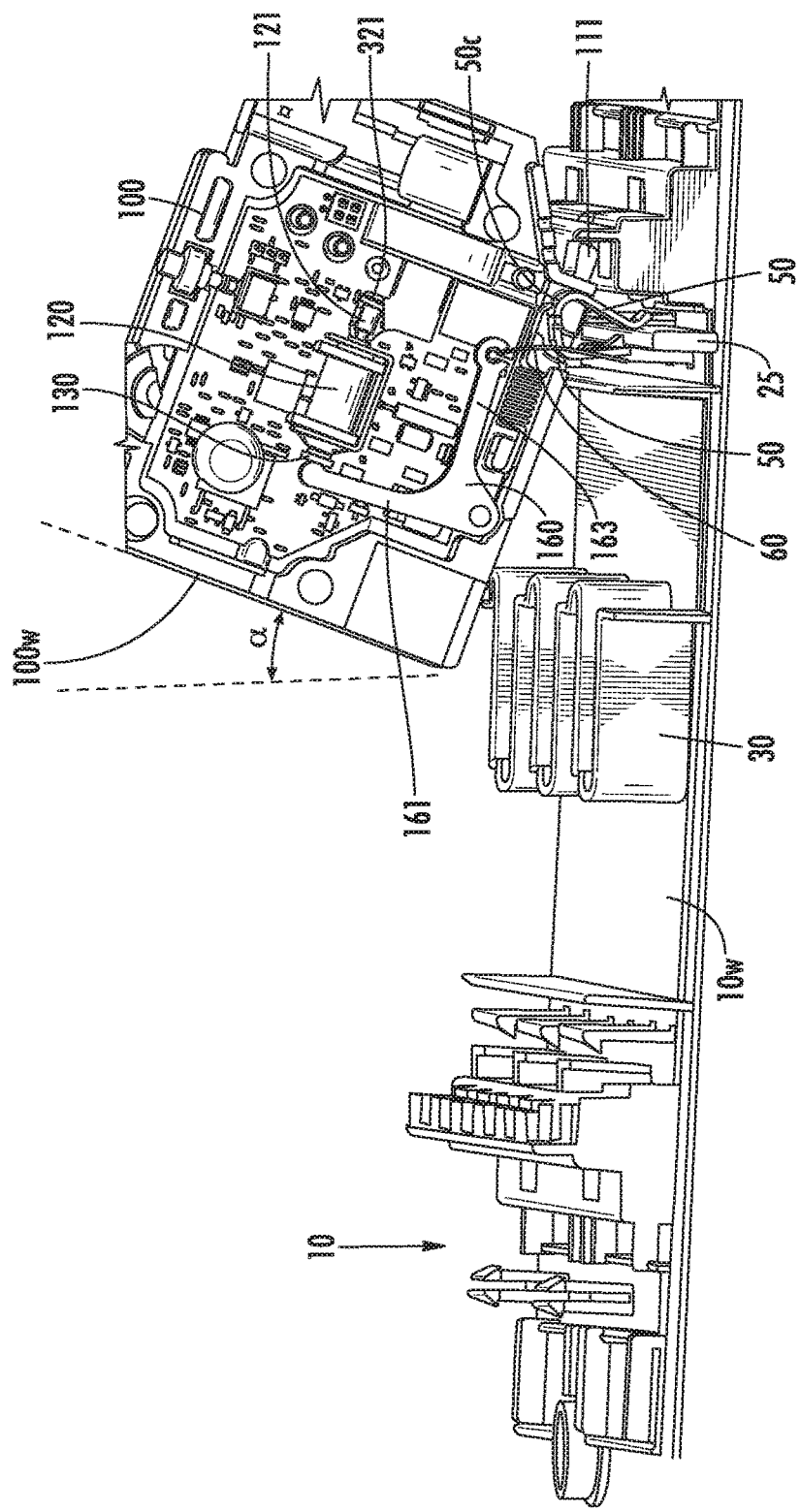
FIG. 2A is a side perspective view of the circuit breaker and load center shown in FIG. 1C with the circuit breaker in a first position relative to the load center according to embodiments of the present invention.

Referring to FIG. 2A and FIG. 2B, the end 161*f* of the first arm 161 of the mechanical coupler 160 travels back and forth a distance "D" (FIG. 5A) relative to the solenoid 120 to move the plunger 130. In some embodiments, the end 163*f* of the second arm 163 can move to a first position (an up position relative to a second position) in the housing 100*h* with the plunger 130 extended and/or the plunger extension 121 retracted (FIG. 2B, 5A) and down to the second position in the housing 100*h* toward the plug-on neutral clip 50 with the plunger 130 retracted and/or the plunger extension 121 extended (FIG. 2A, 6A).

Figure 5B:
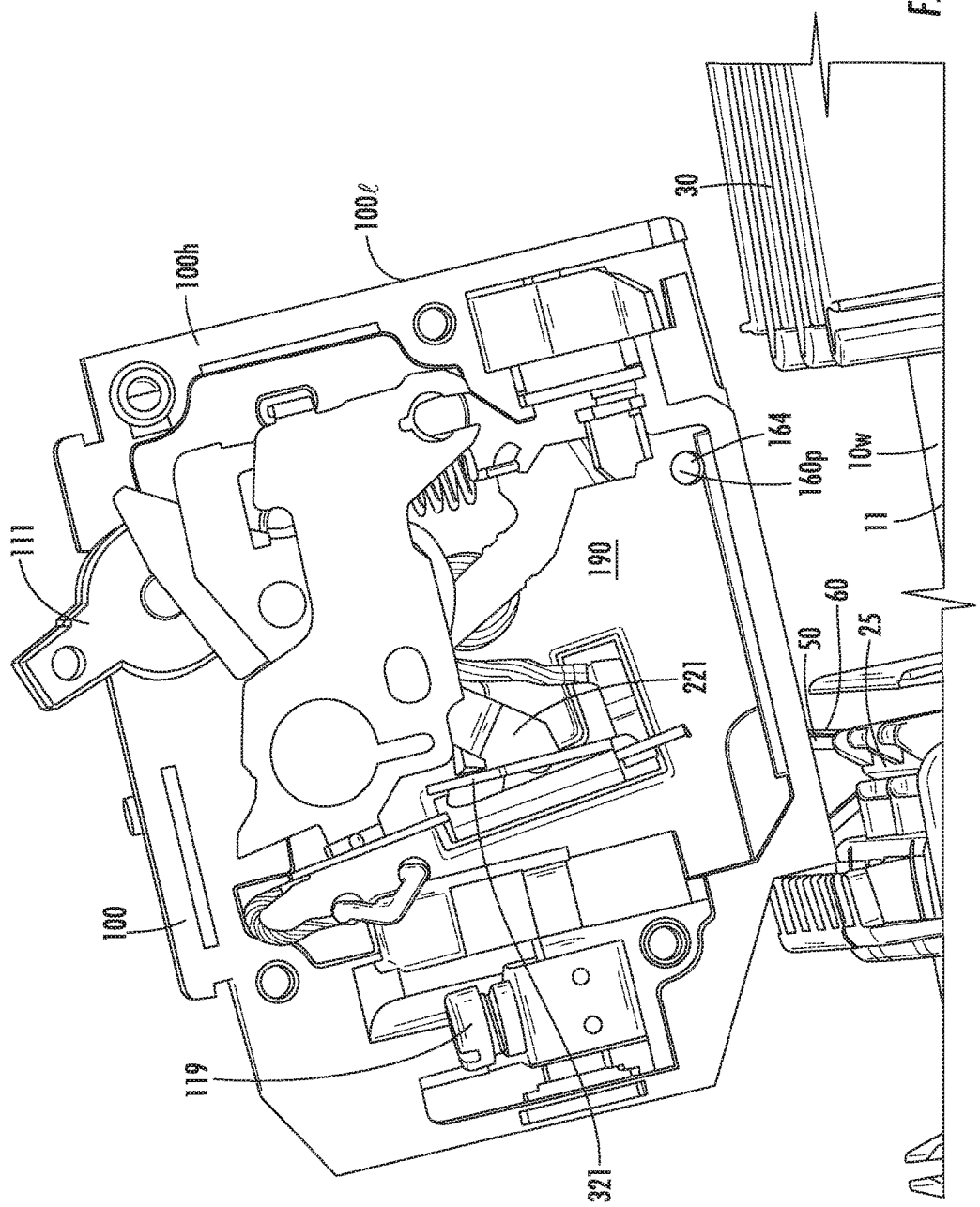
FIG. 5B is an opposing side view of that shown in FIG. 5A.

In some embodiments, the link member 60 can resiliently flex between first and second positions associated with first and second positions of the breaker 100 relative to the wall panel 11 and/or the loadcenter 10, i.e., from a partially or uninstalled or improperly installed position (FIG. 2A, 6A, 6B) to a fully and properly installed position (FIG. 2B, 5A, 5B).

FIG. 2B and FIG. 5A illustrate exemplary positions of the mechanical coupler 160, the plunger 130 and the link member 60 in an installed position (having a greater angle of flexure relative to FIG. 2A, 6A in an uninstalled or mis-installed position) which allows conduction in the ON position. FIG. 2A and FIG. 6A illustrate the mechanical coupler 160 configured to block conduction with the plunger 130 retracted and/or the plunger extension 121 extended and the link member 60 pushed down toward the plug-on neutral clip 50.

FIG. 1, FIG. 2A, FIG. 2B, FIG. 5A, FIG. 6A and FIG. 7A, for example, illustrate that the plug-on neutral clip 50 can have a crown 50*c* that spans across the legs 51 and the crown 50*c* can have a more planar or less tilted configuration when in the installed or second position (FIG. 2B, 5A) relative to the uninstalled or first position (FIG. 2A, 6A). The inner leg 51 can move (i.e., pull or push) the first end portion 61 of the link member 60 inward into the housing further in the second position (FIG. 2B, 5A) relative to the first position (FIG. 2A, 6A).

Figure 7B:
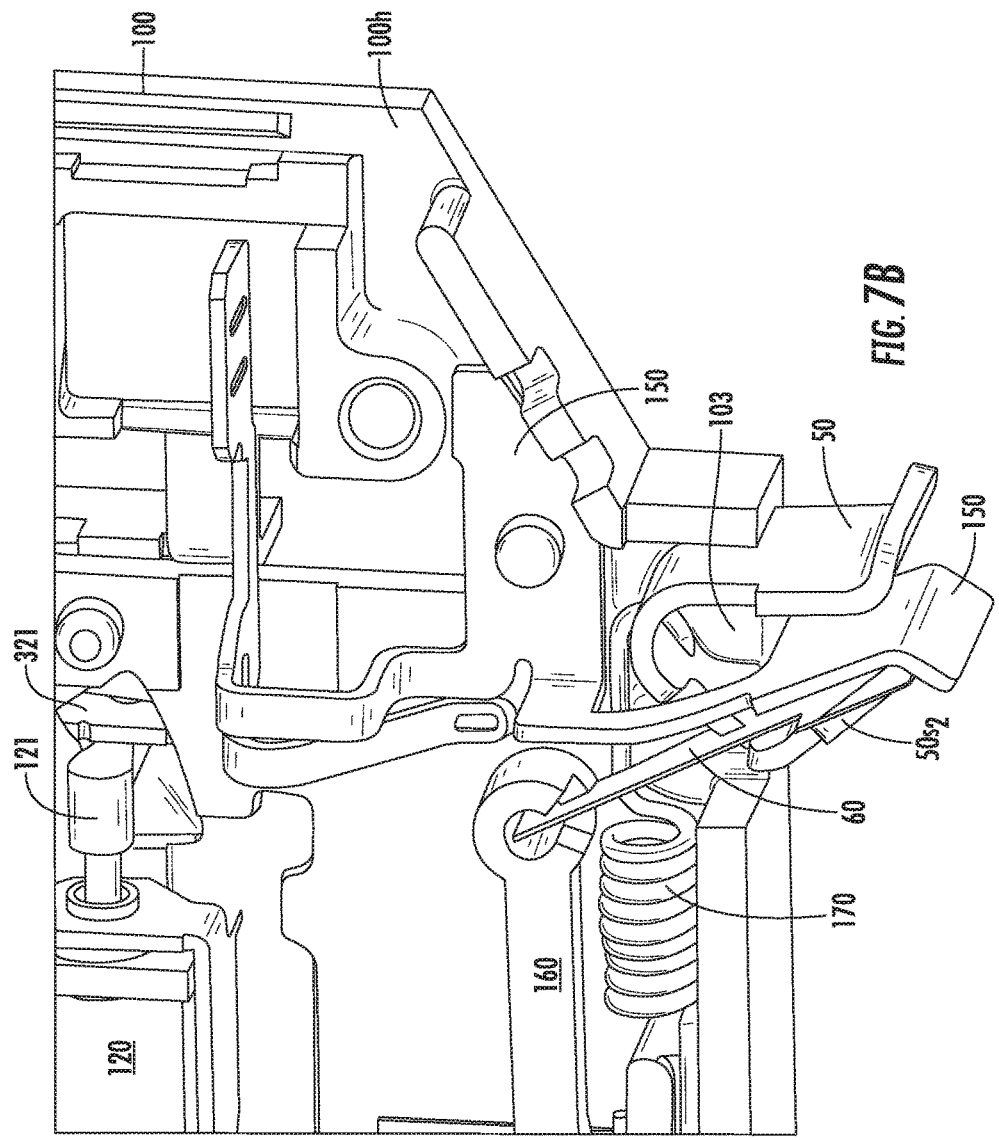

FIGS. 7A and 7B are greatly enlarged illustrations of the circuit breaker 100 illustrating the mechanical coupler 160 and plug-on neutral clip 50 with a neutral bus 150 having a leg 152 that cooperates with the plug-on neutral clip 50. The leg 152 can have a free end 152*f* and can have a length sufficient to extend below the innermost leg 50*s*₂ of the plug-on neutral clip 50. The neutral bus 150 is the conductor that carries electrical current from the plug-on connection at the neutral bar 25 to the collar 119 (FIG. 5B, 6B) where the house wiring is secured. The plug-on neutral clip 50 assures a sufficient clamping force for sufficient electrical connection to carry current from the leg 152 to the panel neutral bar 25. It is noted that actual deformation shapes of the link member 60 and the leg 152 of the neutral bus 150 can vary and, indeed, the link member 60 is not required to be able to flex.

The mechanical coupler 160 can block the breaker mechanism 190 (FIG. 5B, 8A) from latching by providing a lockout state with the latch translated toward the magnet and the latch link 221 of the cradle on a surface of the latch 321 and/or otherwise prevent conduction through the breaker 100 even when a user attempts to turn ON the breaker by moving the handle 111 (FIG. 5A, 6A).

Thus, the circuit breaker 100 has a lockout function using the onboard mechanical coupler 160 that can optionally be coupled to the plunger 130 of the trip solenoid 120 and to the plug-on neutral clip 50. The mechanical coupler 160 can be rotated to move the plunger 130 and/or plunger extension 121 between a position associated with a lock out state and a position associated with an operative state, only allowing conduction based on a defined (properly installed or second)

position (FIG. 5A, FIG. 5B, for example) of the plug-on neutral clip 50 relative to the neutral bar 25.

The plug-on neutral clip 50 can have two extreme positions and can move from a first uninstalled position to a second installed position as the breaker housing 100h is rotated down onto the line stab 30 connection. When the breaker 100 is uninstalled or improperly or partially installed (FIG. 6A, 6B, for example), the mechanical coupler 160, in response to the physical orientation of the plug-on neutral clip 50, can block conduction via the latch 321.

Example line side stabs 30 are shown in FIG. 1B and are omitted to show other features in other figures. The inner wall 100w of the housing 100h can be rotated inward to engage the line side stabs at an angle "a" that is typically between about 30-60 degrees between the first and second positions (FIG. 2A, FIG. 2B). The mechanical coupler 160 can rotate at an angle β between the first and second position that is typically between 10-60 degrees, more typically between 10-30 degrees, and with sufficient rotation to communicate the position of the plug-on neutral clip 50 for the lock out function.

FIG. 6B illustrates an exemplary misapplied or improperly installed configuration with the line side installed but the load side mis-positioned relative to the proper installation position of FIG. 5B.

Referring to FIG. 1C, FIG. 5A, FIG. 6A, and FIG. 7A, the second end portion 62 of the link member 60 can abut the line side facing leg 51 of the plug-on neutral clip 50, which can be a shorter leg than the other leg closer to the handle of the circuit breaker 111. This leg 51 ($50s_2$) can optionally include a ledge 53 as discussed above. Where used, the ledge 53 can taper outward in an outer direction away from the housing to allow the second end portion 62 of the link member 60 to form a conforming flexed tapered shape.

Figure 4A:
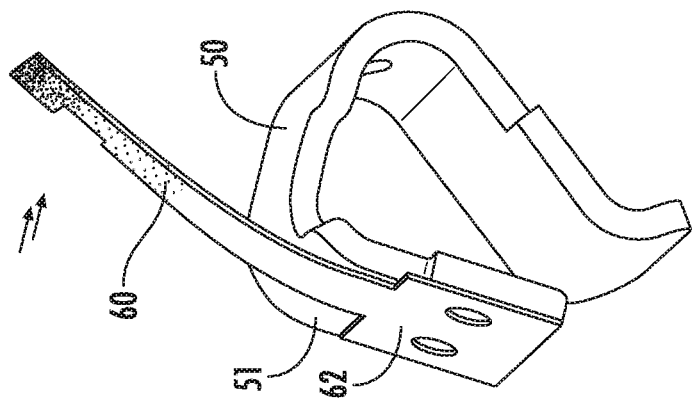
FIGS. 4A and 4B are side perspective views of another embodiment of a plug-on neutral clip and link member according to embodiments of the present invention.
Figure 4B:
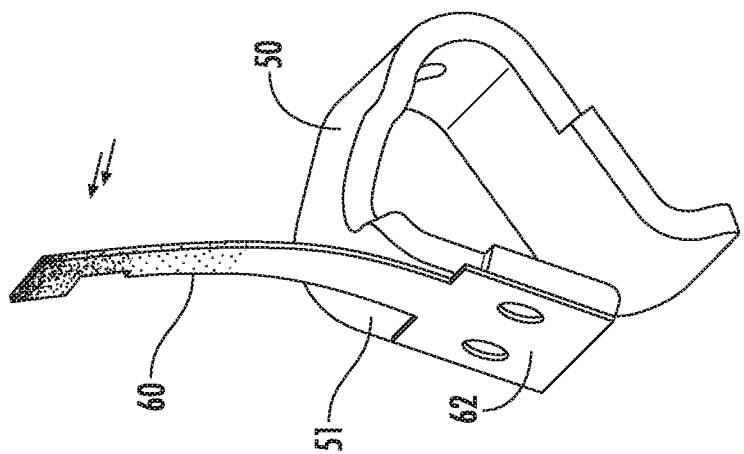

FIG. 3 shows an exemplary link member 60 in an exemplary non-flexed or non-loaded configuration. The second end portion 62 of the link member 60 can engage the ledge 53 of the leg 51 of the plug-on neutral clip 50. Referring to FIGS. 4A and 4B, in some embodiments, the link member 60 can be rigid and attached to one (inner) leg 51 of the clip 50. The second end portion 62 of the link member 60 may be physically attached to the plug-on neutral clip 50 to move in concert with the leg 51. The link member 60 can have a fixed or static configuration and is not required to flex or change shape relative to its shape in the first position (FIG. 2A). The link member 60 can be mechanically clasped, riveted, brazed, welded, pinned, bonded or adhesively attached, and the like. The rigid link member 60 can be configured to provide the desired translation with sufficient clearance to other components as the link member 60 translates from the first position to the second position.

Referring to FIG. 1C, FIG. 5A, FIG. 6A, and FIG. 7A, for example, the mechanical coupler 160 can be attached to housing 100h and/or the circuit board 110 via the pivot joint 160p. In some embodiments, the pivot joint 160p can be adjacent a perimeter wall segment 100p of the housing 100h on a side also holding the plug-on neutral clip 50. The pivot joint 160p can also reside closer the line side 100l of the breaker housing 100h than the load side. The pivot joint 160p can comprise an aperture 164 that holds a pin 165 that is supported by the printed circuit board 110, which can be a thermoplastic pin. The pin 165 can be integrally formed on the mechanical coupler 160 or provided as a discrete, separate component. Other translational and/or pivot configurations may also be used.

While the mechanical coupler 160 is shown as a unitary member with the first and second arms 161, 163, other mechanical coupler configurations may also be used including, for example, cams and multiple bar linkages.

Also, the lockout state provided by the coupler assembly 160A for the electrical conduction block of the breaker mechanism 190, which can optionally be carried out via the latch 221 of the cradle of the breaker mechanism, can be carried out without using the trip solenoid 120 or the plunger extension 121. For example, the mechanical coupler 160 can comprise additional linkages or a different shape and may include a member that directly engages the latch 221 or latch link 31 of the cradle.

The breaker 100 can be an AFCI or GFCI breaker, including a Type BR or CH breaker, or dual purpose AFCI/GFCI and/or may be a molded case circuit breaker.

Figure 9:
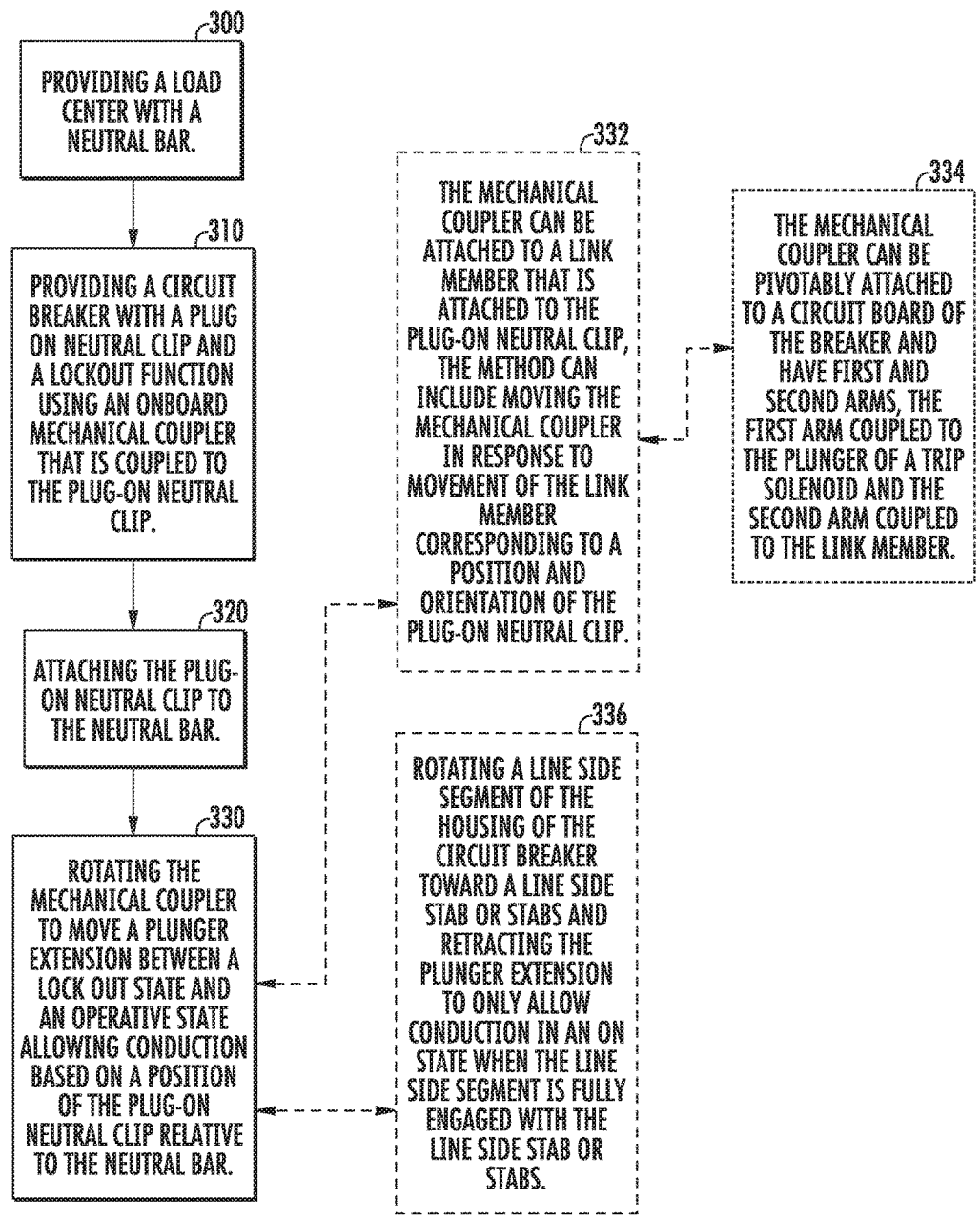
FIG. 9 is a block diagram of a flow chart of operations that can be used to provide a lock out function for a circuit breaker according to embodiments of the present invention.

FIG. 9 illustrates a lockout method for a circuit breaker according to embodiments of the present invention. As shown, a loadcenter with a plug-on neutral bar is provided (block 300). A circuit breaker with a plug on neutral clip and a lockout function using an onboard mechanical coupler that is coupled to breaker mechanism and to the neutral clip is also provided (block 310), optionally via a latch of a breaker mechanism and further optionally via a plunger of a trip solenoid. The neutral clip is attached to the neutral bar (block 320). The mechanical coupler is rotated to move the latch (optionally via a plunger extension) between a lock out state and an operative state (only) allowing conduction based on a position of the plug on neutral clip when in a defined position associated with full and proper installation (block 330).

The mechanical coupler can be attached to a link member that is attached to the plug-on neutral clip. The method can include moving the mechanical coupler in response to movement of the link member corresponding to a position and/or orientation of the plug-on neutral clip (block 332).

The mechanical coupler can be pivotably attached to a circuit board of the breaker and have first and second arms, the first arm coupled to the plunger and the second arm coupled to the link member (block 334).

A line side segment of the housing of the circuit breaker can be rotated inward toward a line side stabs or stabs and the plunger can be extended a distance (with the plunger extension retracted) relative to the trip solenoid to allow conduction in an ON state when the line side segment is fully engaged with the line side stab or stabs (block 336).

The plug-on neutral breaker 100 can be a branch breaker in the loadcenter 10. The loadcenters 10 can be residential or industrial loadcenters. The circuit breaker 100 can be a Type BR or CH AFCI or GFCI breaker or dual purpose AFCI/GFCI.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the invention.

That which is claimed is:

1. A circuit breaker comprising:
a housing;
a plug-on neutral clip held by the housing, wherein the plug-on neutral clip comprises a crown held in the housing and first and second legs that extend out from the housing, and wherein the plug-on neutral clip is held by the housing to be able to slidably move between a first position associated with an uninstalled, partially installed or improperly installed circuit breaker orientation and a second position associated with a properly fully installed circuit breaker orientation; and
a mechanical coupler in the housing coupled to the plug-on neutral clip and configured to provide a lockout state of the circuit breaker and only allow conduction through a breaker mechanism in the housing when the plug-on neutral clip is in the second position to thereby block the breaker mechanism from conduction in the lockout state of the circuit breaker when in the first position, wherein the mechanical coupler has an L-shaped body defining first and second arms.

2. The circuit breaker of claim 1, wherein a medial segment of the mechanical coupler between the first and second arms is pivotably attached to a printed circuit board and/or to the housing.

3. The circuit breaker of claim 1, further comprising a link member coupled to one of the legs of the plug-on neutral clip and to the mechanical coupler.

4. The circuit breaker of claim 3, wherein at least a segment of the link member is configured to move in the housing from the first position to the second position.

5. The circuit breaker of claim 2, wherein the mechanical coupler is pivotably attached at a location that is closer to a line side perimeter of the housing than a load side and on a side of the housing with the legs of the plug-on clip.

6. The circuit breaker of claim 1, wherein the mechanical coupler is pivotably attached to define a pivot attachment to a circuit board holding a trip solenoid and/or to the housing, and wherein, one arm of the first and second arms resides on each side of the pivot attachment.

7. The circuit breaker of claim 6, wherein the first arm extends at an angle between 60-120 degrees from the second arm.

8. The circuit breaker of claim 6, wherein the first arm is coupled to a plunger of a trip solenoid and the second arm is coupled to the plug-on neutral clip.

9. The circuit breaker of claim 1, further comprising a link member having first and second end portions, wherein the mechanical coupler is pivotably attached to a circuit board holding a trip solenoid and/or to the housing, wherein the first arm is coupled to a plunger of a trip solenoid and the second arm is coupled to the first end portion of the link member, and wherein the second end portion of the link member is coupled to the plug-on neutral clip.

10. The circuit breaker of claim 9, wherein the second end portion of the link member is coupled to an inner one of the first and second legs of the plug-on neutral clip which is closest to a line side of the circuit breaker.

11. The circuit breaker of claim 3, wherein the link member has a curvilinear shape.

12. A circuit breaker comprising:
a housing;
a plug-on neutral clip held by the housing, wherein the plug-on neutral clip comprises a crown held in the housing and first and second legs that extend out from the housing, and wherein the plug-on neutral clip is held by the housing to be able to slidably move between a first position associated with an uninstalled, partially installed or improperly installed circuit breaker orientation and a second position associated with a properly fully installed circuit breaker orientation; and
a mechanical coupler in the housing coupled to the plug-on neutral clip and configured to provide a lockout state of the circuit breaker and only allow conduction through a breaker mechanism in the housing when the plug-on neutral clip is in the second position to thereby block the breaker mechanism from conduction in the lockout state of the circuit breaker when in the first position,
wherein the mechanical coupler is pivotably attached to a circuit board, the circuit board holding a trip solenoid, and/or to the housing to define a pivot attachment, and wherein the mechanical coupler comprises spaced apart first and second arms, one on each side of the pivot attachment,
wherein the first arm is coupled to a plunger of a trip solenoid and the second arm is coupled to the plug-on neutral clip, and
wherein the first arm rotates at an angle $\beta$ that is between 10-30 degrees to cause a plunger extension of the trip solenoid to linearly extend and retract, wherein the plunger extension is extended to engage a latch of the breaker mechanism in the first position to force a no-latch condition for the breaker mechanism in the circuit breaker and prevent conduction in an ON position, and wherein the plunger extension retracts toward the trip solenoid a distance sufficient to release the latch and allow conduction in the ON position in the second position.

13. A circuit breaker comprising:
a housing;
a plug-on neutral clip held by the housing, wherein the plug-on neutral clip comprises a crown held in the housing and first and second legs that extend out from the housing, and wherein the plug-on neutral clip is held by the housing to be able to slidably move between a first position associated with an uninstalled, partially installed or improperly installed circuit breaker orientation and a second position associated with a properly fully installed circuit breaker orientation;
a mechanical coupler in the housing coupled to the plug-on neutral clip and configured to provide a lockout state of the circuit breaker and only allow conduction through a breaker mechanism in the housing when the plug-on neutral clip is in the second position to thereby block the breaker mechanism from conduction in the lockout state of the circuit breaker when in the first position; and
a neutral bus in the housing with a leg that extends out of the housing between the first and second legs of the plug-on neutral clip and also engages the first or second leg of the plug-on neutral clip, and wherein the circuit breaker is a plug-on neutral type BR or CH circuit breaker or a dual purpose AFCI/GFCI.

14. A circuit breaker comprising:
a housing;
a plug-on neutral clip held by the housing, wherein the plug-on neutral clip comprises a crown held in the housing and first and second legs that extend out from the housing, and wherein the plug-on neutral clip is held by the housing to be able to slidably move between a first position associated with an uninstalled, partially installed or improperly installed circuit breaker orientation and a second position associated with a properly fully installed circuit breaker orientation;

a mechanical coupler in the housing coupled to the plug-on neutral clip and configured to provide a lockout state of the circuit breaker and only allow conduction through a breaker mechanism in the housing when the plug-on neutral clip is in the second position to thereby block the breaker mechanism from conduction in the lockout state of the circuit breaker when in the first position; and a link member having first and second end portions, the first end portion coupled to the mechanical coupler, wherein one of the first and second legs of the plug-on neutral clip comprises a laterally extending ledge that is outside the housing and is coupled to the second end portion of the link member.

15. A load center comprising: the circuit breaker of claim 1, a circuit breaker comprising:

a housing;

a plug-on neutral clip held by the housing, wherein the plug-on neutral clip comprises a crown held in the housing and first and second legs that extend out from the housing, and wherein the plug-on neutral clip is held by the housing to be able to slidably move between a first position associated with an uninstalled, partially installed or improperly installed circuit breaker orientation and a second position associated with a properly fully installed circuit breaker orientation; and a mechanical coupler in the housing coupled to the plug-on neutral clip and configured to provide a lockout state of the circuit breaker and only allow conduction through a breaker mechanism in the housing when the plug-on neutral clip is in the second position to thereby block the breaker mechanism from conduction in the lockout state of the circuit breaker when in the first position, wherein the load center comprises a wall holding at least one vertically extending neutral bar having a planar and straight outwardly extending rectangular body and one or more line side stabs, wherein the plug-on neutral clip slidably engages the neutral bar, and wherein one or more terminals at a line side of the housing of the circuit breaker engage the one or more line side stabs.

16. The loadcenter of claim 15, wherein the mechanical coupler is pivotably attached to the housing and/or a circuit board holding a trip solenoid at a pivot joint and comprises first and second spaced apart arms, one on each side of the pivot joint, wherein, once the plug-on neutral clip slidably engages the neutral bar, rotation of a line side of the housing of the circuit breaker into the one or more line stabs to the properly and fully installed orientation causes the plug-on neutral clip to the second position to push an end of the first arm of the mechanical coupler which rotates the second arm and retracts a plunger extension toward the trip solenoid thereby allowing conduction, and wherein when the circuit breaker is not properly and fully installed with the neutral bus bar and the one or more line stabs, the plug-on neutral clip is in the first position which rotates the end of the first arm to force the second arm to push the plunger toward the trip solenoid and extend the plunger extension relative to the trip solenoid thereby blocking the breaker mechanism to prevent conduction in an ON position of a handle of the circuit breaker.

17. A method for lockout of a plug-on neutral circuit breaker, comprising:

providing a load center with a plug-on neutral bar;

providing a circuit breaker with a plug-on neutral clip and an onboard mechanical coupler that is coupled to the plug-on neutral clip;

attaching the plug-on neutral clip to the neutral bar;

moving the mechanical coupler between (i) a lock out state to force a no latch condition for a breaker mechanism of the circuit breaker preventing conduction when the circuit breaker is uninstalled or partially installed based on a first position of the plug-on neutral clip when attached to the neutral bar and (ii) an operative state allowing conduction based on a second position of the attached plug-on neutral clip associated with proper installation; and rotating a line side of the housing of the circuit breaker inward toward a line side stab or stabs after attaching the plug-on neutral clip to the neutral bar causing the movement of the mechanical coupler to allow conduction in the operative state only when the line side of the housing is properly installed.

18. The method of claim 17, wherein the mechanical coupler comprises an L-shaped body defining first and second arms, the first arm coupled to a trip solenoid and the second arm coupled to the plug-on neutral clip, wherein the L-shaped body forces a plunger of the trip solenoid to linearly travel to a position that generates the lock out state.

19. A method for lockout of a plug-on neutral circuit breaker, comprising:

providing a load center with a plug-on neutral bar;

providing a circuit breaker with a plug-on neutral clip and an onboard mechanical coupler that is coupled to the plug-on neutral clip;

attaching the plug-on neutral clip to the neutral bar; and moving the mechanical coupler between (i) a lock out state to force a no latch condition for a breaker mechanism of the circuit breaker preventing conduction when the circuit breaker is uninstalled or partially installed based on a first position of the plug-on neutral clip when attached to the neutral bar and (ii) an operative state allowing conduction based on a second position of the attached plug-on neutral clip associated with proper installation, wherein the circuit breaker further comprises a neutral bus with a leg that extends out of the housing and also engages the plug-on neutral clip, wherein the attaching step comprises forcing the leg of the neutral bus against the neutral bus bar of the load center using the plug-on neutral clip, wherein the mechanical coupler is attached to a link member that is attached to the plug-on neutral clip, and wherein the moving the mechanical coupler comprises rotating the mechanical coupler in response to movement of the link member between the first and second positions of the attached plug-on neutral clip.

20. The method of claim 19, wherein the mechanical coupler is pivotably attached to a circuit board and/or housing of the circuit breaker and has first and second arms, the first arm coupled to a plunger of a trip solenoid and the second arm coupled to the link member, wherein the rotating comprises pivoting the first and second arms in concert so that the first am extends the plunger out of the trip solenoid and retracts a plunger extension of the trip solenoid in response to the link member pivoting the second arm inward to thereby allow the operative state.

* * * * *

UNITED STATES PATENT AND TRADEMARK OFFICE
CERTIFICATE OF CORRECTION

PATENT NO. : 10,381,182 B2
APPLICATION NO. : 15/840029
DATED : August 13, 2019
INVENTOR(S) : Jeffrey Scott Gibson It is certified that error appears in the above-identified patent and that said Letters Patent is hereby corrected as shown below:

In the Specification

Column 3, Line 40: Please correct "first am" to read -- first arm --

Column 9, Line 14: Please correct "angle "a"" to read -- angle "$\alpha$" --

In the Claims

Column 13, Lines 17-18, Claim 15: Please remove the phrase "the circuit breaker of claim 1,"

Column 14, Line 62, Claim 20: Please correct "first am" to read -- first arm --

Signed and Sealed this
Twelfth Day of November, 2019

Andrei Iancu
*Director of the United States Patent and Trademark Office*